United States Patent
Gibbons et al.

(10) Patent No.: US 10,097,774 B2
(45) Date of Patent: Oct. 9, 2018

(54) READ-OUT INTEGRATED CIRCUIT WITH INTEGRATED COMPRESSIVE SENSING

(71) Applicants: Robert C. Gibbons, Richardson, TX (US); Martin S. Denham, Bend, OR (US); Eric J. Beuville, Goleta, CA (US); David U. Fluckiger, Allen, TX (US)

(72) Inventors: Robert C. Gibbons, Richardson, TX (US); Martin S. Denham, Bend, OR (US); Eric J. Beuville, Goleta, CA (US); David U. Fluckiger, Allen, TX (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 15/322,633

(22) PCT Filed: Jul. 10, 2015

(86) PCT No.: PCT/US2015/039855
§ 371 (c)(1),
(2) Date: Dec. 28, 2016

(87) PCT Pub. No.: WO2016/010838
PCT Pub. Date: Jan. 21, 2016

(65) Prior Publication Data
US 2017/0134672 A1    May 11, 2017

Related U.S. Application Data

(60) Provisional application No. 62/023,842, filed on Jul. 12, 2014.

(51) Int. Cl.
*H04N 5/345* (2011.01)
*H04N 5/919* (2006.01)
(Continued)

(52) U.S. Cl.
CPC ............... *H04N 5/345* (2013.01); *G06K 9/20* (2013.01); *H03M 7/3062* (2013.01);
(Continued)

(58) Field of Classification Search
CPC ........ H04N 5/345; H04N 5/919; H04N 5/378; H03M 7/30
See application file for complete search history.

(56) References Cited

U.S. PATENT DOCUMENTS

2013/0342681 A1* 12/2013 Duong ............... G06K 9/00986
348/135

FOREIGN PATENT DOCUMENTS

CN    103686006 A  *  3/2014
JP    2015109629 A     6/2015

OTHER PUBLICATIONS

International Search Report and Written Opinion for application No. PCT/US2015/039855 dated Oct. 19, 2015.
(Continued)

*Primary Examiner* — Ahmed A Berhan
(74) *Attorney, Agent, or Firm* — Lando & Anastasi, LLP

(57) ABSTRACT

According to one aspect, a Read-Out Integrated Circuit (ROIC) with integrated Compressive Sampling (CS) is provided. The ROIC includes an input to couple to a photodetector array including a plurality of photodetectors and is configured to generate compressed image data by sampling and summing the values of the plurality of photodetectors consistent with a set of Compressive Sampling Measurement Matrices and provide the resulting coded aggregates to a signal processor as compressed image data.

19 Claims, 5 Drawing Sheets

(51) Int. Cl.
  *H04N 5/378* (2011.01)
  *G06K 9/20* (2006.01)
  *H03M 7/30* (2006.01)
  *H04N 5/347* (2011.01)
  *G06K 9/46* (2006.01)

(52) U.S. Cl.
  CPC ............ *H04N 5/347* (2013.01); *H04N 5/378* (2013.01); *H04N 5/919* (2013.01); *G06K 2009/4695* (2013.01)

(56) References Cited

OTHER PUBLICATIONS

Zhang et al., "Block-Based Compressive Sampling for Digital Pixel Sensor Array" IEEE, 2010, 2nd Asia Symposium on Quality Electronic Design, pp. 9-12.

Dadkah, Mohammadreza, "CMOS Image Sensors With Compressive Sensing Acquisition", Website of McCaster University, Feb. 28, 2013, pp. 1-181. Retrieved from the Internet: <URL: https://macsphere.mcmaster.ca/pitstream/11375/13028/1/fulltext.pdf>.

Oike et al. "CMOS Image Sensor with Per-Column SD ADS and Programmable Compressed Sensing," IEEE Journal of Solid-State Circuits, Jan. 2013, vol. 48, No. 1, p. 318-328.

\* cited by examiner

READ-OUT INTEGRATED CIRCUIT WITH INTEGRATED COMPRESSIVE SENSING

CROSS-REFERENCE TO RELATED APPLICATIONS

This application is a U.S. National Stage Application under 35 U.S.C. § 371 of International Application No. PCT/US2015/039855, filed Jul. 10, 2015, titled READ-OUT INTEGRATED CIRCUIT WITH INTEGRATED COMPRESSIVE SENSING, which is hereby incorporated herein by reference in its entirety for all purposes. International Application No. PCT/US2015/039855 claims priority to U.S. Provisional Patent Application No. 62/023,842, filed Jul. 12, 2014, titled READ-OUT INTEGRATED CIRCUIT WITH INTEGRATED COMPRESSIVE SENSING.

BACKGROUND

Focal plane arrays (FPAs) have increased in photodetector array dimensions exponentially over the past several decades. This increase in photodetector array dimensions has resulted in ever expanding requirements for power, bandwidth, and complexity required to capture and transmit images from FPAs. Traditional approaches to addressing the bandwidth problem have involved the use of image compression, implemented in either hardware or software. However, these approaches require collection of the entire image, and therefore sampling of every photodetector in the FPA, before processing for bandwidth reduction. Traditional practices of compressing video data after collection have area, power and architecture complexity penalties.

SUMMARY OF INVENTION

Aspects and embodiments are directed to Read-Out Integrated Circuits (ROICs) for FPAs with integrated compressive sensing (CS). As discussed in more detail below, the ROIC with integrated CS substantially reduces the number of samples employed to describe the entire image by sampling the photodetectors consistent with various CS methods.

According to one aspect, a Read-Out Integrated Circuit (ROIC) with integrated Compressive Sampling (CS) is provided. The ROIC with integrated CS includes an input to couple to a photodetector array including a plurality of photodetectors and a CS component operatively connected to the photodetector array. The CS component is configured to generate compressed image data by generating a plurality of sums of photodetector values based on a set of Compressive Sampling Measurement Matrices (CSMM's) including at least one vector of coded measurements and output the compressed image data to, for example, a signal processor.

According to one embodiment, the plurality of photodetectors are individually addressable by a row address and a column address. According to one embodiment, the at least one vector of coded measurements is generated by a pseudo-random number source (which could be memory or a random number generator). According to one embodiment, the plurality of photodetectors are segmented into a plurality of regions, each of the plurality of regions including at least one group of photodetectors.

According to one embodiment, at least one region of the plurality of regions has a compression rate of one. According to one embodiment, at least one group of photodetectors comprises at least a four by four matrix of photodetectors, and wherein the CS component is further configured to compute in parallel a plurality of sums based on selectively reading a subset of photodetectors of the at least one group based on the at least one vector of coded measurement values, aggregate the plurality of sums into a coded aggregate, and store the coded aggregate in the compressed image data. According to one embodiment, the CS component is further configured to store the at least one vector of measurement codes in the compressed image. According to one embodiment, the at least one vector of coded measurement codes includes at least one of a decimal zero and a decimal one. According to one embodiment, the at least one group is a first group and a second group, and wherein the compressed image data includes at least one coded aggregate of the first group and at least one coded aggregate of the second group, respectively.

According to one embodiment, the compressed image data includes a total number of coded aggregates totaling in number a fraction of the potential photodetector values had each respective photodetector of the plurality of photodetectors been measured.

According to one aspect, an FPA imaging system is provided. The FPA imaging system comprises a memory, at least one processor coupled to the memory, a photodetector array including a plurality of photodetectors, a ROIC with integrated CS coupled to the at least one processor and the photodetector array, and an image reconstruction engine configured to instruct the at least one processor to reconstruct at least one image based on compressed image data. The ROIC with integrated CS is configured to generate the compressed image data by generating a plurality of sums of photodetector values based on a set of Compressive Sampling Measurement Matrices (CSMM's) including at least one vector of coded measurements, and to output the compressed image data to the at least one processor.

According to one embodiment, the compressed image data includes at least one coded aggregate. According to one embodiment, the at least one coded aggregate represents at least one region of the plurality of regions. According to one embodiment, the compressed image data includes at least one vector of measurement codes. According to one embodiment, the at least one region is a first region and a second region and the reconstruction engine is further configured to instruct the at least one processor to reconstruct a first image based on the first region and the at least one vector of measurement codes, reconstruct a second image based on the second region and the at least one vector of measurement codes, wherein the first image and the second image are reconstructed in parallel, and combine the first image and the second image. According to one embodiment, the at least one processor is at least one of a Graphics Processing Unit (GPU) and a Field-Programmable Gate Array (FPGA).

According to at least one aspect, a Read-Out Integrated Circuit (ROIC) with integrated Compressive Sampling (CS) is provided. The ROIC includes an input to couple to a photodetector array including a plurality of photodetectors, a mask generator and control component configured to generate a plurality of Compressive Sampling Measurement Matrices (CSMMs) each descriptive of a sampling pattern to sample at least one portion of the photodetector array, and a compute element array coupled to the input and the mask generator and control component. The compute element array is configured to receive a plurality of photodetector values from the photodetector array, receive the CSMMs from the mask generator and control component, generate compressed image data by sampling the photodetector array consistent with the plurality of CSMMs, and provide the compressed image data to at least one processor.

In one embodiment, the compute element array includes a plurality of compute elements each including a memory coupled to a logic core. The memory may include, for example, 2-port static random access memory (SRAM). The memory may store the compressed image data and the logic core may be configured to determine the compressed image data. It is appreciated that the ROIC may further include a block mapping component configured to direct at least one portion of the plurality of photodetector values to each compute element of the plurality of compute elements.

In one embodiment, the mask generator and control component includes at least one of a pseudo-random number generator and a unique-random number generator. In one embodiment, the mask generator and control component includes a memory and wherein the mask generator and control component generates the plurality of CSMMs at least in part by reading at least one stored CSMM from the memory. In one embodiment, the plurality of CSMMs each include at least one of a decimal zero, a decimal one, and a decimal negative one.

In one embodiment, the photodetector array includes a plurality of portions. In one embodiment, one or more portions of the plurality of portions of the photodetector array have a compression rate of one. In one embodiment, the compute element array is further configured to compute in parallel a plurality of coded aggregates by selectively sampling the plurality of portions of the photodetector array consistent with the plurality of CSMMs and wherein the compressed image data includes the plurality of coded aggregates.

In one embodiment, the ROIC further includes an analog-to-digital converter (ADC) coupled between the input and the compute element array configured to digitize the plurality of photodetector values received from the photodetector array. It is appreciated that the plurality of photodetectors may include a plurality of digital pixels and the plurality of photodetector values may includes a plurality of pixel values.

According to at least one aspect, a focal plane array (FPA) imaging system is provided. The FPA imaging system includes at least one processor, a photodetector array including a plurality of photodetectors, and a Read-Out Integrated Circuit (ROIC) with integrated Compressive Sampling (CS) coupled between the at least one processor and the photodetector array. The ROIC is configured to generate a plurality of Compressive Sampling Measurement Matrices (CSMMs) each descriptive of a sampling pattern to sample at least one portion of the plurality of photodetectors, generate compressed image data by sampling the plurality of photodetectors consistent with the plurality of CSMMs, and to output the compressed image data to the at least one processor.

In one embodiment, the photodetector array includes a plurality of digital pixels. In one embodiment, the ROIC includes a mask generator and control component configured to generate the plurality of CSMMs. In one embodiment, the mask generator and control component includes at least one of a pseudo-random number generate and a unique-random number generator.

In one embodiment, the ROIC includes a compute element array configured to generate the compressed image data including a memory coupled to a logic core. In one embodiment, the FPA further includes an image reconstruction engine configured to instruct the at least one processor to reconstruct at least one image based on the compressed image data.

Still other aspects, embodiments, examples, and advantages are discussed in detail below. The embodiments and/or examples disclosed herein may be combined with other embodiments and/or examples in any manner consistent with at least one of the principles disclosed herein, and references to "an embodiment," "some embodiments," "an alternate embodiment," "various embodiments," "one embodiment," "an example," "some examples," "an alternate example," "various examples," "one example," or the like are not necessarily mutually exclusive and are intended to indicate that a particular feature, structure, or characteristic described may be included in at least one embodiment and/or example. The appearances of such terms herein are not necessarily all referring to the same embodiment and/or example.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DESCRIPTION OF THE INVENTION

Figure 1:
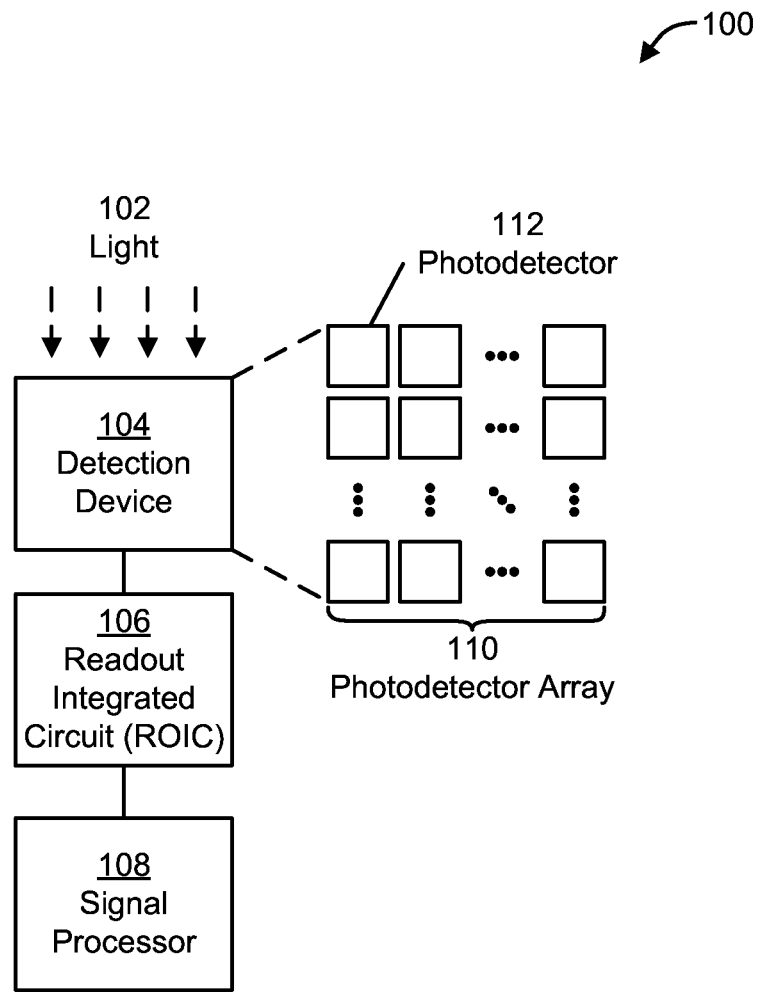
FIG. 1 is a block diagram of one example of an FPA imaging system according to aspects of the invention.

There is a need for reducing the video output bandwidth requirements of imaging systems while also maintaining or reducing power consumption and/or increasing frame rate with negligible impact on the image resolution. These aspects may be particularly relevant for implementation of compact video storage and wireless transmission. Accordingly, aspects and embodiments are directed to Readout Integrated Circuits (ROICs) with integrated on-chip Compressive Sensing (CS) that allows the ROIC to generate compressed image data. For example, the ROIC with integrated CS may be coupled to a photodetector array including a plurality of photodetectors and generate compressed image data representative of the image acquired by the photodetector array consistent with various CS techniques.

CS leverages the fact that many signals, including many video or image signals, are "sparse," in the sense that the "information rate" of the signal may be significantly smaller than suggested by the signal's bandwidth. When the signal is represented in an appropriate basis or domain, many coefficients may be close to or equal to zero. If a signal is sparse in some domain, then it is not necessary to follow the classic requirements of the Shannon-Nyquist sampling theorem. Accordingly, the signal can be represented by a sparse sampling set, which may use a very small amount of data compared that the data needed to capture the entire signal. According to certain embodiments, compressive sensing on an ROIC takes advantage of the presumed sparsity of the image signals and provides compressed image data in place of the original pixel values.

Image compression may be achieved by using a set of measurement matrices (e.g., masks) each with a dimension of X by Y that is a percentage of the total number of pixels in the photodetector array. For example, if the photodetector array has 640×480 pixels, the photodetector array may be conceptually divided into a plurality of rectangular regions that are each 32×32 pixels (totaling 1024 pixel locations in each rectangular region). There would then be 20×15 regions of 32×32 pixels to cover the 640×480 photodetector array. If 10% compression is desired, the 1024 pixel locations would be sampled by 102 measurement matrices (e.g., 0.10×1024 pixel locations). Each measurement matrix of the 102 measurement matrices may have a dimension equal to the dimension of the region being sampled (e.g., 32×32) and include a "1" or a "0" at each location. Each of 102 measurement matrices is applied to the set of pixel values (e.g., 32×32) to determine a coded aggregate. The coded aggregate may include a sum of the pixel values from all of the pixel locations where the measurement matrix contains a "1." Accordingly, each of the measurement matrices provides one coded aggregate value (e.g., 102 coded aggregates for the 102 measurement matrices). The 102 coded aggregate values are transmitted from the ROIC, instead of the original 1024 values, resulting in approximately 10% of the original size (90% reduction). It is appreciated that the distribution between "1's" and "0's" in the measurement matrices may satisfy one or more predetermined criteria. For example, the set of 102 measurement matrices may require a percentage of "1's" at each pixel location. In some implementations, 50% of the 102 measurement matrices may contain a "1" at any given pixel location (e.g., [1,1]). Stated differently, each pixel value may be included in 50% of the 102 coded aggregates. In another example, the power spectral density of each measurement matrix applied to a given block of pixel values may be close to a constant (e.g., white).

Aspects and embodiments are directed to ROICs for focal plane arrays (FPAs) with integrated CS, such that the image compression is performed directly on the ROIC. In particular, certain embodiments are directed to a type of ROIC where a coded aggregate of photodetectors of the FPA are sampled, with the resulting output being this digitally encoded aggregate of the sampled photodetectors. The coding may be implemented entirely in the digital domain on the ROIC, and collection control and timing may be digitally controlled, as discussed further below. Additionally, as also discussed further below, certain aspects include parallel acquisition of sums of sampled photodetector values with their unique encoding, unlike conventional post-collection compressive sensing approaches in which the data measurements are acquired in a sequential manner. Technical advantages provided by aspects and embodiments may include improved die-size, feasibility, cost, performance, bandwidth usage, and power consumption of ROICs having on-chip CS, for a given number of photodetectors, relative to conventional architectures. This approach inherently saves bandwidth, and in some applications, reduces the power consumption of the ROIC as well.

FIG. 1 is a block diagram illustrating an example FPA imaging system 100. The FPA imaging system 100 includes a detection device 104 that includes a plurality of photodetectors 112 arranged in a photodetector array 110 and configured to receive incident light 102. The FPA imaging system 100 further comprises an ROIC 106 and a signal processor 108.

In one embodiment, the detection device 104 employs a plurality of photodetectors 112 in the photodetector array 110 to receive the incident light 102. The photodetectors 112 are photo-sensitive devices that may accumulate charge (e.g., in a charge coupled device (CCD) sensor) or produce a current and/or voltage (e.g., in a complementary metal oxide semiconductor (CMOS) sensor) in response to light incident upon the photodetector 112. The photodetector 112 may include, for example, a photovoltaic detector, a barrier device detector, a position sensitive detector (PSD), or other suitable detector. Each photodetector 112 may be individually addressed based on a unique address (e.g., row and column value). It is appreciated that photodetector array 110 may include digital pixels that provide digitized image data to, for example, the ROIC 106.

In some embodiments, an ROIC 106 is coupled to the detection device 104. The ROIC 106 may receive, for example, the accumulated charge or current and/or voltage signals from the detection device 104 and digitize the received information for receipt by the signal processor 108. The ROIC 106 may output the received information representative of the image to, for example, the signal processor 108. It is appreciated that the ROIC 106 may receive digitized image information from the detection device 104 and, thereby, omit the analog-to-digital conversion functionality.

Figure 2B:
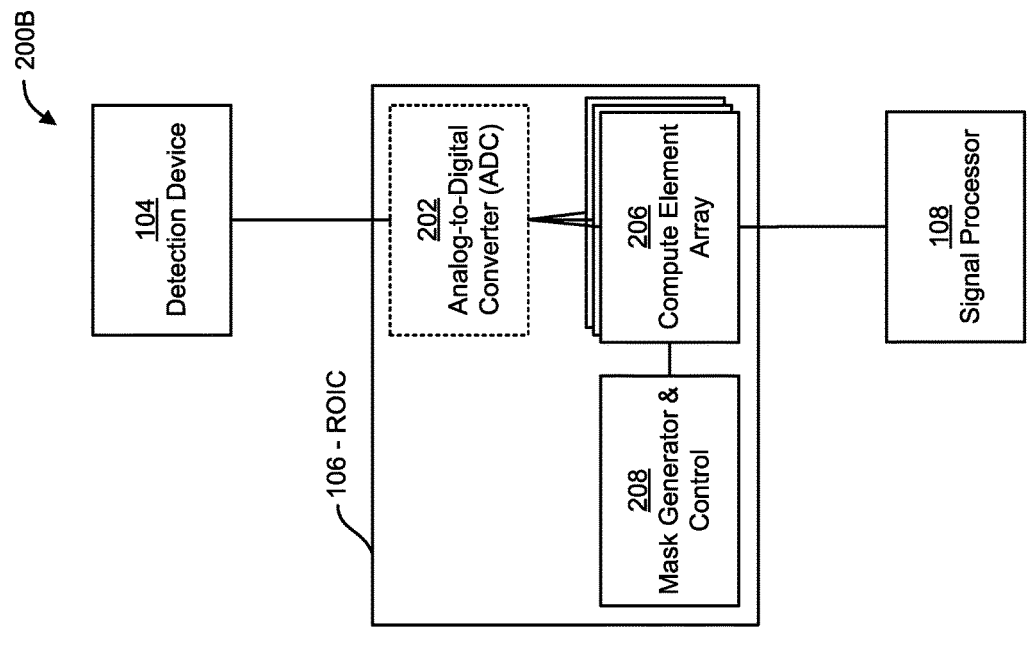
FIGS. 2A and 2B are block diagrams of example FPA imaging systems according to aspects of the invention.

In some embodiments, the ROIC 106 includes a CS component. In these embodiments, the ROIC 106 may generate compressed image data representative of image captured by the photodetectors 112 consistent with various CS techniques and provide the compressed image data to, for example, the signal processor 108. By integrating the CS component within the ROIC 106, a design is achieved wherein the sampling and compression of the photodetectors 112 is performed simultaneously, which permits a higher number of photodetectors 112 to be utilized without a proportional increase in power and bandwidth to capture and transmit image data. Example implementations of the ROIC 106 with the CS component are described further below with reference to FIGS. 2A and 2B.

In one embodiment, a signal processor 108 is coupled to the ROIC 106 and receives digitized information from the ROIC 106 representative of the incident light 102 on the detection device 104. The digitized information received from the ROIC 106 may include, for example, compressed image information consistent with various compressive sensing methods. The signal processor 108 may reconstruct the captured image, analyze the compressed image information, send the compressed image information to an external system, and/or direct various components of the FPA imaging system (e.g., a rotating mirror). The signal processor 108 may be a generic processor or a specialized processor (e.g., a digital signal processor). The signal processor 108 may include, for example, other functional components such as a video processing unit, a graphics processing unit, an embedded processor, a single instruction, multiple data digital signal processor (SIMD DSP), and internal memory (not shown). It is appreciated that the functionality of the signal processor 108 may be included within and/or performed by ROIC 106.

Figure 2A:
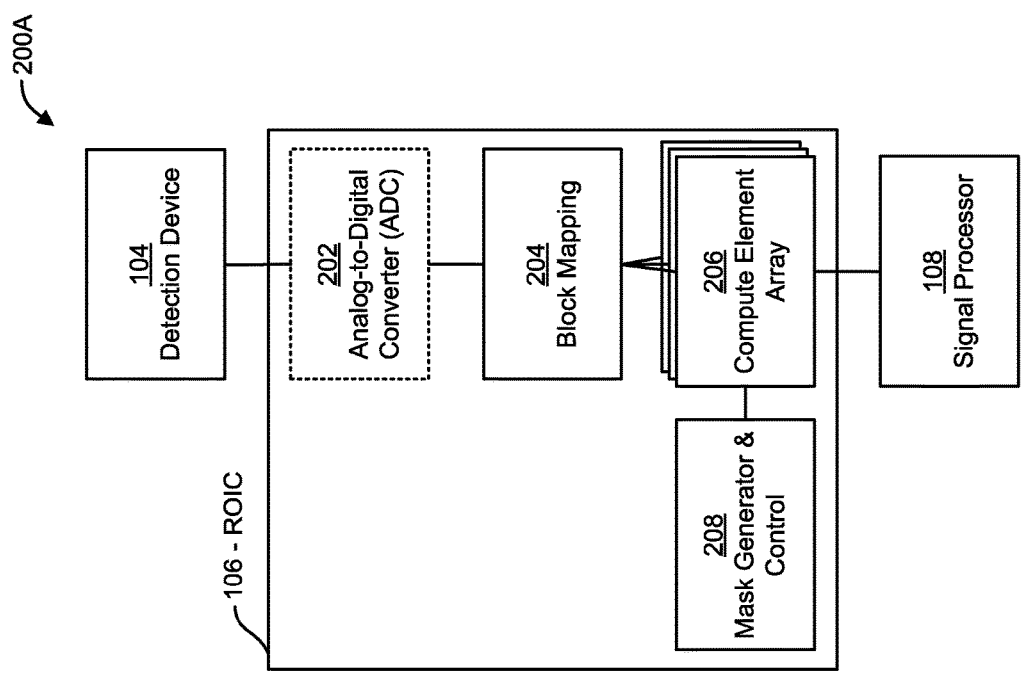

FIG. 2A illustrates an example FPA imaging system 200A with a CS component integrated into the ROIC 106. The example FPA imaging system 200A includes a detection device 104, an ROIC 106, and a signal processor 108. As illustrated in FIG. 2A, the ROIC 106 includes a block mapping component 204, a compute element array 206, a mask generator and control component 208, and an optional analog-to-digital converter (ADC) 202.

In some examples, the detection device 104 may provide analog photodetector values representative of the intensity and/or characteristics of the light incident on the respective photodetector (e.g., photodetector 112). In these examples, the ROIC 106 may include the ADC 202 coupled to the detection device 104 to digitize the analog photodetector values received from the detection device 104 to generate digital pixel values. The ADC 202 may include a column ADC constructed to, for example, digitize one or more columns of analog photodetector values at a time. It is appreciated that the ADC 202 may be omitted in examples employing digital pixels or other types of detection devices 104 that provide digital pixel values.

example, if the original size of an image is 1000 Mbytes and the compressed size is 100 Mbytes, the CR is 10 (1000 Mbytes/100 Mbytes=10). In some examples, the number of photodetectors 112 included in each block may be scaled up. For example, the block size may be set equal to the same size as the photodetector array 110. In other examples, the blocks may be scaled to a size which optimizes the CR and is smaller than the full size of the photodetector array 110. For example, a 256×256 block size may enable a CR of 10 without significant loss of image quality. Employing block sizes smaller than the photodetector array 110 may also enable parallel compression of the individual photodetector groups by the ROIC 106 and, thereby, reduce the computation time to compress an image. The reduction of compression times may allow the ROIC 106 to, for example, compress frames in a live video stream. Example block size configurations are illustrated below in Table 1 for an example detection device 104.

TABLE 1

|  | Configuration #1 | Configuration #2 | Configuration #3 | Configuration #4 |
| --- | --- | --- | --- | --- |
| Number of Pixels | 76800 | 76800 | 76800 | 76800 |
| Detector Row Size | 320 | 320 | 320 | 320 |
| Detector Column Size | 240 | 240 | 240 | 240 |
| Block Row Size | 4 | 8 | 16 | 32 |
| Block Column Size | 4 | 8 | 16 | 32 |
| Coded Aggregates per Block | 4 | 8 | 32 | 128 |
| Total Number of Blocks | 4800 | 1200 | 300 | 75 |
| Number of Coded Aggregates | 19200 | 9600 | 9600 | 9600 |
| Compression Rate (CR) | 4 | 8 | 8 | 8 |
| Operations Per Image to Compress Image | 307,200 | 614,400 | 2,457,600 | 9,830,400 |

As illustrated in FIG. 2A, the FPA imaging system 200A includes a block mapping component 204 coupled to the compute element array 206. The block mapping component 204 directs digital pixel values received from the detection device 104 (and/or the ADC 202) to the appropriate compute element within the compute element array 206. The block mapping component 204 may, for example, divide the digital pixel values into a set of blocks and direct each block (or a portion of each block) to a particular compute element of the compute element array 206. The block mapping component 204 may include, for example, a programmable manifold that may be reconfigured to change the target compute element for a given block (or a portion thereof) of digitized pixel values. Dividing the pixel values into a set of blocks and directing each block into a compute element may enable the ROIC 106 to compress multiple sub-sections of an image simultaneously and, thereby, reduce the time required to compress an image. It is appreciated that the image may be divided into multiple sub-sections without a block mapping component 204 as illustrated by FPA imaging system 200B in FIG. 2B. The interconnections between the detection device 104 or the ADC 202 and the compute element array 206 may be hardwired to output digital pixel values in a particular location of an image to a preselected compute element of the compute element array 206.

Figure 3:
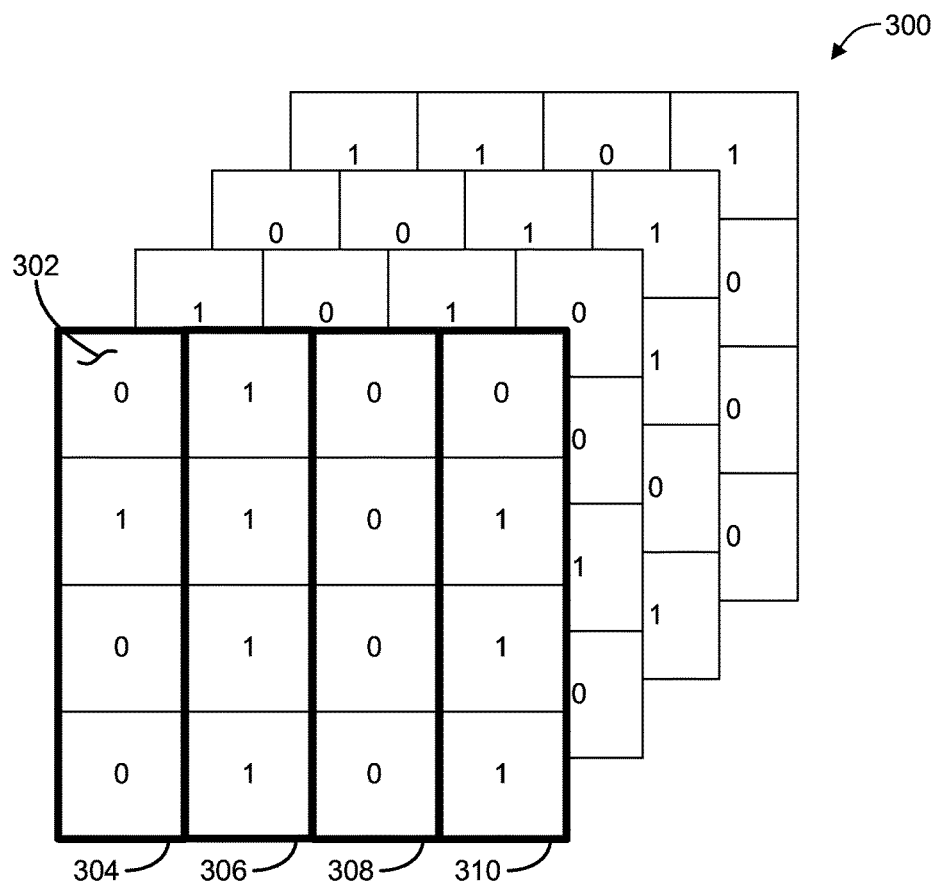
FIG. 3 is a block diagram of an example set of measurement matrices according to aspects of the invention.

The size of the blocks may be selected based on any number of design parameters including, for example, desired compression rate (CR), desired quality of the reconstructed image, and/or hardware constraints of the ROIC 106. As used herein, CR is defined as the ratio between uncompressed data size and compressed data size. CR is simply the uncompressed size divided by the compressed size. For Table 1 illustrates four possible block size configurations for a detection device with 76,800 total pixels in a grid with 320 rows and 240 columns. In the first configuration, the block size selected is a square that is four by four pixels containing a total of sixteen pixels. The block of sixteen pixels is sampled four times by four separate two-dimensional measurement matrices also with a four by four dimension. The measurement matrices may provide a "road map" for which digital pixel values (e.g., which photodetectors 112 of the photodetector array 110) the ROIC 106 needs to sample and sum to produce coded aggregates. For example, the measurement matrices may dictate which pixel values of the 16 total pixel values need to be summed to form a coded aggregate sample. An example set of measurement matrices are illustrated in FIG. 3 and described in more detail further below. Four coded aggregate values may be generated for each of the 4,800 blocks of sixteen pixels yielding 19,200 coded aggregate samples to capture the entire image. Applying the four measurement matrices to each of the blocks requires 307,200 operations (e.g., addition and/or subtraction operations) to be performed by the ROIC 106. The resulting compressed image data includes the 19,200 coded aggregate samples (as opposed to the 76,800 pixel values) and yields a CR of approximately 4 (e.g., 76,800/19,200). The subsequent configurations (e.g., the second, third, and fourth configurations) illustrate the effects of increasing the block size from a four by four square of pixel values up to a block size of 32 by 32 pixel values. It is appreciated that the CRs illustrated in table 1 may be slightly lower in some implementations to account for any overhead information required to, for example, decode the compressed image. In some implementations, the measurement matrices may be sent together with the coded aggregate samples as the compressed image data. In other implementations, only the coded aggregates may be transmitted as the compressed image data. In these implementations, the target device (e.g., the device that receives the compressed image data) may already have a copy of the measurement matrices and/or be capable of generating the measurement matrices based on a previously determined seed.

As illustrated by Table 1, various block sizes may be employed for any particular implementation of ROIC 106 based on the desired performance and/or the hardware constraints of the ROIC 106. For example, larger block sizes may produce better image reconstruction results because the power spectral density of each measurement matrix (e.g., mask) applied to a given block of pixel values may be closer to a constant (e.g., white). These larger block sizes, however, may require additional operations to be performed by the ROIC 106 to compress the image and, thereby, require a faster ROIC 106 and/or process images at a slower rate. Conversely, selecting a smaller block size may substantially reduce the total number of operations required by the ROIC 106 and allow the ROIC 106 to operate at a slower frequency and/or process image frames at a higher frame rate.

In some examples, the ROIC 106 may only apply the measurement matrices to a portion of the blocks as described above and leave the remaining block uncompressed. Stated differently, the ROIC 106 may provide uncompressed image data for the remaining blocks. For example, the ROIC 106 may not compress a group of pixel values that are capturing image data associated with a region of interest. In another example, the images being processed by the ROIC 106 are part of a 60 Hz video stream. In this example, the ROIC 106 may divide the array of pixel values into 60 blocks and compress (e.g., using the CS techniques described herein) 59 of the 60 blocks in each frame while leaving the last block uncompressed. The specific block that remains uncompressed may change in each frame such that a single version of each block is transmitted uncompressed each second (e.g., every 60 frames). Thereby, the ROIC 106 could transmit a full resolution image in each second. It is appreciated that other methods may be employed to select various portions of the image to remain uncompressed.

As discussed above, CS performs a random set of measurements and is effective at reliably detecting the "information" (e.g., non-repeating pixel values) based on the information being "sparse." In the ROIC 106, compute elements within the compute element array 206 may perform the sampling of the digital pixel values consistent with the measurement matrices (e.g., the mask). FIG. 3 illustrates an example set of measurement matrices 300 that may be generated by, for example, the mask generator and control component 208 and applied to pixel values by the compute element array 206. The set of measurement matrices 300 includes four two-dimensional matrices that each include measurement code vectors 304, 306, 308, and 310 in addition to a plurality of measurement codes 302. Each of the two-dimensional measurement matrices may have the same (or similar) dimension as the section of the image being sampled and each measurement code 302 may correspond to a pixel value. Each compute element of the compute element array 206 may apply a measurement matrix to a block of pixel values by adding the pixel values that have a corresponding measurement code 302 of "1" and ignoring pixel values that have a corresponding measurement code 302 of "0" to produce a coded aggregate value for the measurement matrix. It is appreciated that measurement matrices may be formed from decimal values other than "0" and "1" as illustrated in FIG. 3. For example, the measurement matrix may be formed by values of "0," "1," and "−1" or "1" and "−1" where a "−1" may indicate that the corresponding pixel value should be subtracted (as opposed to added) to produce the coded aggregate.

The compute element array 206 may provide a coded aggregate for each measurement matrix within the set of measurement matrices 300. For example, the compute element array 206 may provide four coded aggregate codes for the four matrixes illustrated by the set of measurement matrices 300. The coded aggregates and corresponding measurement matrices may form the compressed image data that may be provided by the ROIC 106 to, for example, signal processor 108. In other examples, the compressed image data may include only the coded aggregates and the seed used to generate the measurement matrices. In still other examples, one or more parameters may be included with the coded aggregates in the compressed image data including parameters relating to region definitions of the FPA, sampled block size, CR, region information, and an operation mode of the FPA in which the coded aggregates were computed. It will be appreciated by those skilled in the art, given the benefit of this disclosure, that the compressed image data may include various combinations of values.

Figure 4:
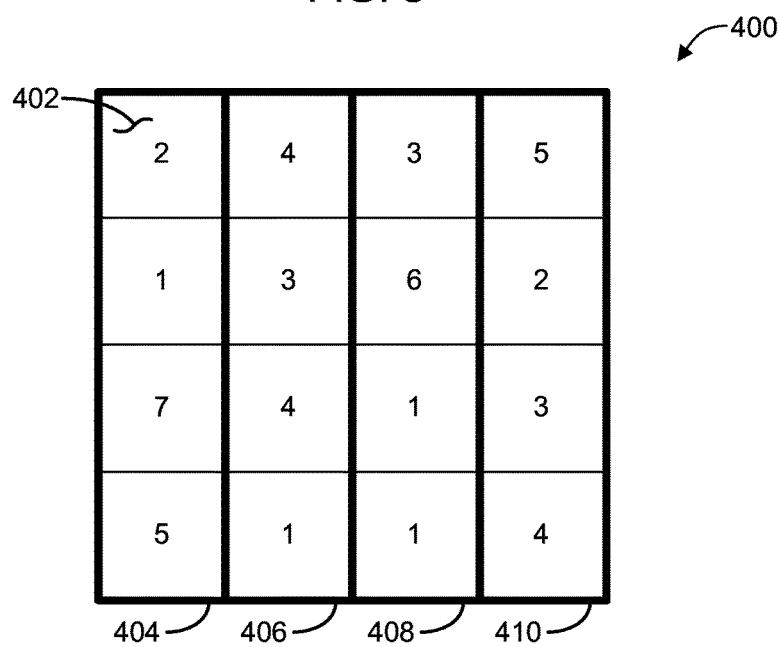
FIG. 4 is a block diagram illustrating an example matrix of photodetector values associated with a captured image according to aspects of the invention.

FIG. 4 illustrates an example matrix of pixel values 400 that may be combined with the set of measurement matrices 300 by the compute element array 206. The matrix of pixel values 400 includes a plurality of values each being associated with image information from a photodetector 112 of the photodetector array 110. The matrix of pixel values 400 may include pixel value columns 404, 406, 408, and 410. The compute element array 206 may combine the first pixel value column 404 with the first measurement code vector 304 to yield a value of 1. The second pixel value column 406 may also be combined with the second measurement code vector 306 to yield a value of 12. The third pixel value column 408 may also be combined with the third measurement code vector 308 to yield a value of 0. The fourth pixel value column 410 may also be combined with the fourth measurement code vector 310 to yield a value of 9. The column-wise aggregate values of 1, 12, 0, and 9 may be summed to yield a total coded aggregate value of 22 for the first measurement matrix of the set of measurement matrices 300. The compute element array 206 may continue to compute coded aggregates with the subsequent measurement matrices within the set of measurement matrices 300 with the matrix of pixel values 400 to yield a set of 4 coded aggregate values. It is appreciated that the measurement matrices 300 may be constructed such that each pixel value in the matrix of pixel values 400 is included in at least one coded aggregate. For example, at least one matrix of the set of measurement matrices may include a "1" in each position of the matrix (e.g., [1,1]). In other examples, the measurement matrices may be constructed such that each pixel value is included in a pre-determined proportion of coded aggregates. For example, the set of measurement matrices may be constructed that includes each pixel value in 50 percent of the coded aggregates.

As described above, the measurement matrices 300 include measurement codes 302 that indicate, for example, which photodetectors 112 to sample from the photodetector array 110. In some examples, a plurality of measurements are performed in parallel on the photodetector array 110 based on the measurement matrices 300. For example, a first parallel measurement may be based on the first measurement code vector 304 and a second parallel measurement based on the second measurement code vector 306. Subsequent to the first measurement and the second measurement, a summation of the measured photodetector values may be aggregated. In other examples, each measurement occurs sequentially (e.g., serially). It should be understood that measurement of the photodetectors 112 may be performed N number of times and calculated in other ways. For example, in one embodiment, the coded aggregates from each measurement performed may be averaged and/or weighted to produce a single weighted coded aggregate. It should be further understood that decimal values, summation of the decimal values, and aggregation of the decimal value may be represented in other ways. For example, the summation may be based on binary values and binary arithmetic applied thereto.

It is appreciated that the coded aggregate for the matrix need not be calculated in a column-by-column fashion first as illustrated in the examples above. The measurement matrices and associated pixel values may be traversed by the ROIC 106 in any fashion to generate the coded aggregates. For example, the ROIC 106 may traverse a set of measurement matrices in a depth-wise fashion first as opposed to a row-by-row or a column-by-column traversal. Traversing the set of measurement matrices in a depth-wise fashion may be advantageous because it removes the necessity to re-visit each pixel value (e.g., pixel value [2, 2]) multiple times by applying all of the corresponding measurement matrix values (e.g., measurement matrix values [2, 2, 1] through [2, 2, z]) to the respective pixel value first before moving on to other pixel values (e.g., pixel value [2, 3]).

As described above, the compute element array 206 generates coded aggregates based on measurement matrices and pixel values. Each compute element in the compute element array 206 may include, for example, a dedicated block of memory coupled to a logic core. The dedicated block of memory in each compute element may store the aggregate codes for each measurement matrix of the set of measurement matrices. The dedicated block of memory may include, for example, a register file implemented as 2-port static random access memory (SRAM) with one read port and one write port. Employing 2-port SRAM may improve compressing speed by enabling read and write operations to be performed simultaneously. In this example, the ROIC 106 could operate on lower clock frequencies and still generate high frame rates. For example, the system may have a clock rate of 25 MHz and generate frames at a rate in excess of 1 KHz. The logic core coupled to each block of dedicated memory may receive the mask values and/or the pixel values in addition to performing the addition and/or subtraction operations to produce the coded aggregates. The logic core may include, for example, circuitry capable of performing addition and/or subtraction of two binary values as is known to those skilled in the art. In at least one example, the logic core includes an arithmetic logic unit (ALU) to perform, for example, the addition and/or subtraction operations for two binary values. It is appreciated that multiple dedicated blocks of memory may share a single logic core in some implementations.

In some examples, the measurement matrices include a decimal value of "−1" and, thereby, require the logic core to perform a subtraction operation to determine the coded aggregate in instances where the measurement matrix value is a "−1." In these examples, the pixel values may be represented as two's complement values and the logic core may perform the subtraction operation by inventing (e.g., flipping) the bits and adding one to make the pixel value negative and subsequently adding the negative pixel value to the running total of the coded aggregate. Thereby, a logic core capable of inverting bits and adding binary values can perform a subtraction operation to determine a coded aggregate.

The measurement matrices employed by the compute element array 206 may be generated by the mask generator and control component 208. The mask generator and control component 208 may generate suitable masks by any of a variety of mechanisms. For example, a set of masks may be stored in memory and retrieved from memory as appropriate. In other examples, the masks may be generated on-the-fly to reduce the memory footprint in the ROIC 106. For example, the masks may be generated by a pseudo-random number generator or a unique-random number generator and balanced (e.g., filtered) to make the power spectral density of the mask closer to a constant (e.g., white). In another example, the masks may be generated by a masking function that generates white (or near white) measurement matrices.

It is appreciated that the measurement matrix may contain non-random values. For example, a non-random vector of measurement codes may enable an emphasis on low frequency sampling in initial measurements. In this example, low frequency sampling may provide an initial image with reduced resource demands on the ROIC. Further, low frequency sampling may indicate the approximate "sparseness" of the sampled image and be used in subsequent calculations of, for example, photodetector group size, measurement code randomness, etc.

It will be understood by those skilled in the art, given the benefit of this disclosure, that the ROIC with compressive sensing greatly reduces bandwidth by a substantial factor. For example, a CR of 10 will reduce the required bandwidth to represent or transmit the compressed image by 90%. For certain architectures, power consumption reduction of similar factors is possible (e.g., fewer digital line drivers are required). In other cases, it may be possible to increase the overall focal plane frame rate with negligible impact on image resolution. Such reduced bandwidth requirements may be critical for implementation of compact video storage and wireless transmission.

It is appreciated that the ROIC 106 may be controlled by one or more external devices (e.g., signal processor 108) to control, for example, the CR, block sizes, and/or the sample rate. In some examples, the ROIC 106 may receive control signals to dynamically vary the CR and/or sample rate based on the content of the reconstructed image. For example, the CR of the ROIC 106 may be adjusted to accommodate a higher outputted sample rate of the image, or a region of interest (ROI) in the image. As discussed above, a CR of 10 is a 90% reduction of bandwidth. Thus, adjusting the CR of the overall FPA or of particular regions of the FPA enables highly flexible bandwidth management. In one example, the CR (and accordingly, the block size) of only certain regions of interest may be altered while over other regions a constant CR is maintained. In this example, an image reconstruction engine may generate reconstructed images by reusing previously reconstructed images of low-sample rate regions in combination with data related to high-sample rate ROI. Stated differently, the image reconstruction engine may generate images based on regions with different rates of sampling by reusing reconstructed images from regions which are sampled less frequently.

In some examples, the image reconstruction engine may be part of an image reconstruction device including, for example, a computer system with sufficient ram, memory, and processor for the reconstruction of an image and/or a Field-Programmable Gate Array (FPGA). In these examples, the image reconstruction engine may be a compiled set of instructions to be executed by a processor including, for example, a Graphics Processing Unit (GPU). In other examples, the image reconstruction device may be an integrated circuit which outputs a reconstructed original image to other hardware devices (e.g., computer systems, displays, digital-video logging recorders, etc.).

The reconstruction engine may reconstruct the image (or a portion thereof) based on any of the repertoire of known CS methods. In addition, the image reconstruction engine may reconstruct an image based on parallel processing of one or more regions, the associated coded aggregates and measurement codes therein. This "parallel" mode allows an image to be reconstructed region-by-region in far less time than a single processor reconstructing the entire image sequentially. Once the regions of an original image have been reconstructed they are then combined to form the reconstructed original image. It is appreciated that the image reconstruction device may receive the compressed image data from a remote ROIC (e.g., via WiFi®, RF, Ethernet, etc.). In these examples, bandwidth and power is conserved by performing reconstruction of the original image on a device remote from the ROIC. In the case of wireless transmission, CS may reduce the baseband bandwidth which can lead to numerous improvements in wireless transmission, including inherent additional encryptive properties, reduced detectability/jam-ability, improved transmission distance, and so forth. This may be advantageous in various applications including an airborne FPA with an associated ground-based receiver. In other embodiments, the image reconstruction device may be coupled to the ROIC and receive the compressed image data via a communication bus.

Figure 5:
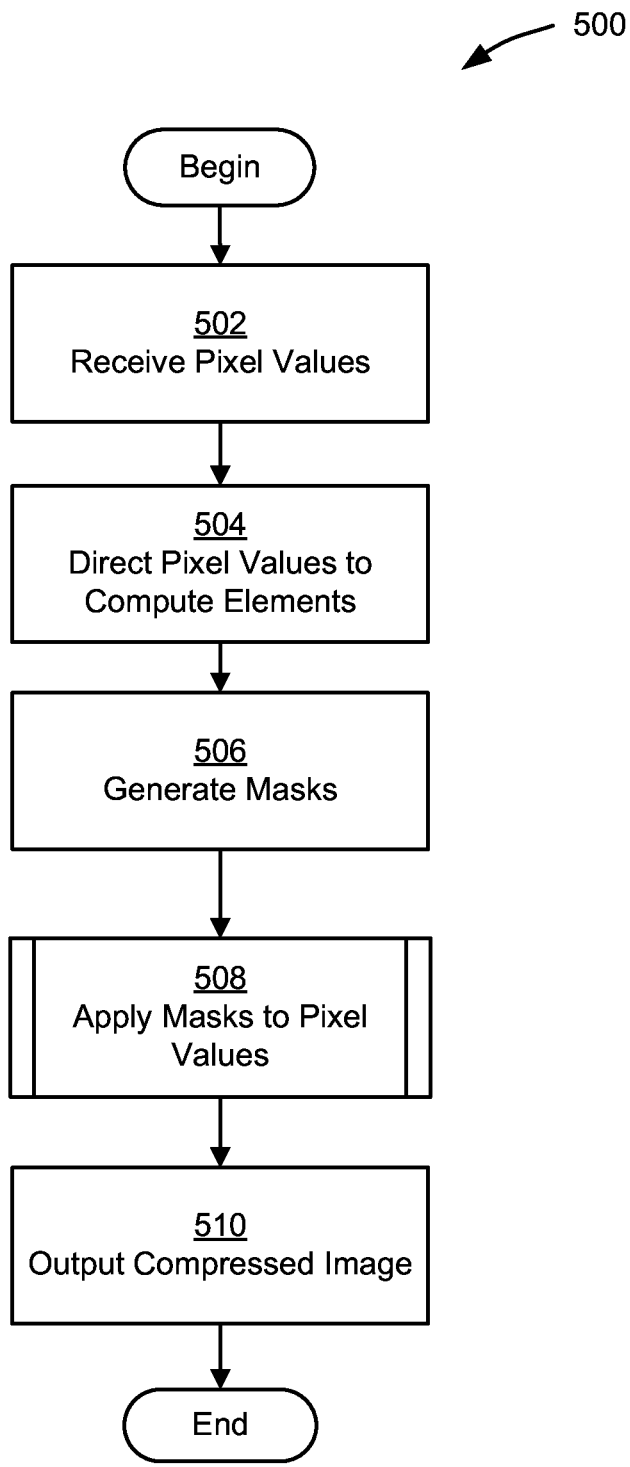
FIG. 5 is a flow diagram illustrating an example method of compressive sensing.

Referring to FIG. 5, an example compressive sensing process 500 performed by a ROIC (e.g., ROIC 106) to generate compressed image data is illustrated. The compressive sensing process 500 generates compressed image data to be provided to, for example, a signal processor (e.g., signal processor 108) based on pixel values received from a photodetector array.

In act 502, the ROIC receives pixel values from, for example, a detection device (e.g., detection device 104). The pixels values may be digital pixel values and/or analog pixel values. In examples where the ROIC receives analog pixel values, the ROIC may digitize the analog pixel values by, for example, an ADC for subsequent processing.

In act 504, the pixel values are directed to one or more compute elements within a compute element array. The pixel values may be directed to the compute element by, for example, a fixed set of interconnections and/or a programmable manifold. In act 506, the ROIC generates the masks for the compute elements. The masks may be generated on-the-fly by a pseudo-random number generator and/or stored in memory and accessed. The generated mask values may be applied to the pixel values by the compute elements of the ROIC in act 508 to generate the coded aggregates. An example process of computing the coded aggregates is described below with reference to FIG. 6.

In act 510, the ROIC outputs the compressed image. The compressed image may be represented by, for example, the coded aggregates and/or the masks employed to generate the coded aggregates. The compressed image may be provided to an image processor and/or another external device.

Figure 6:
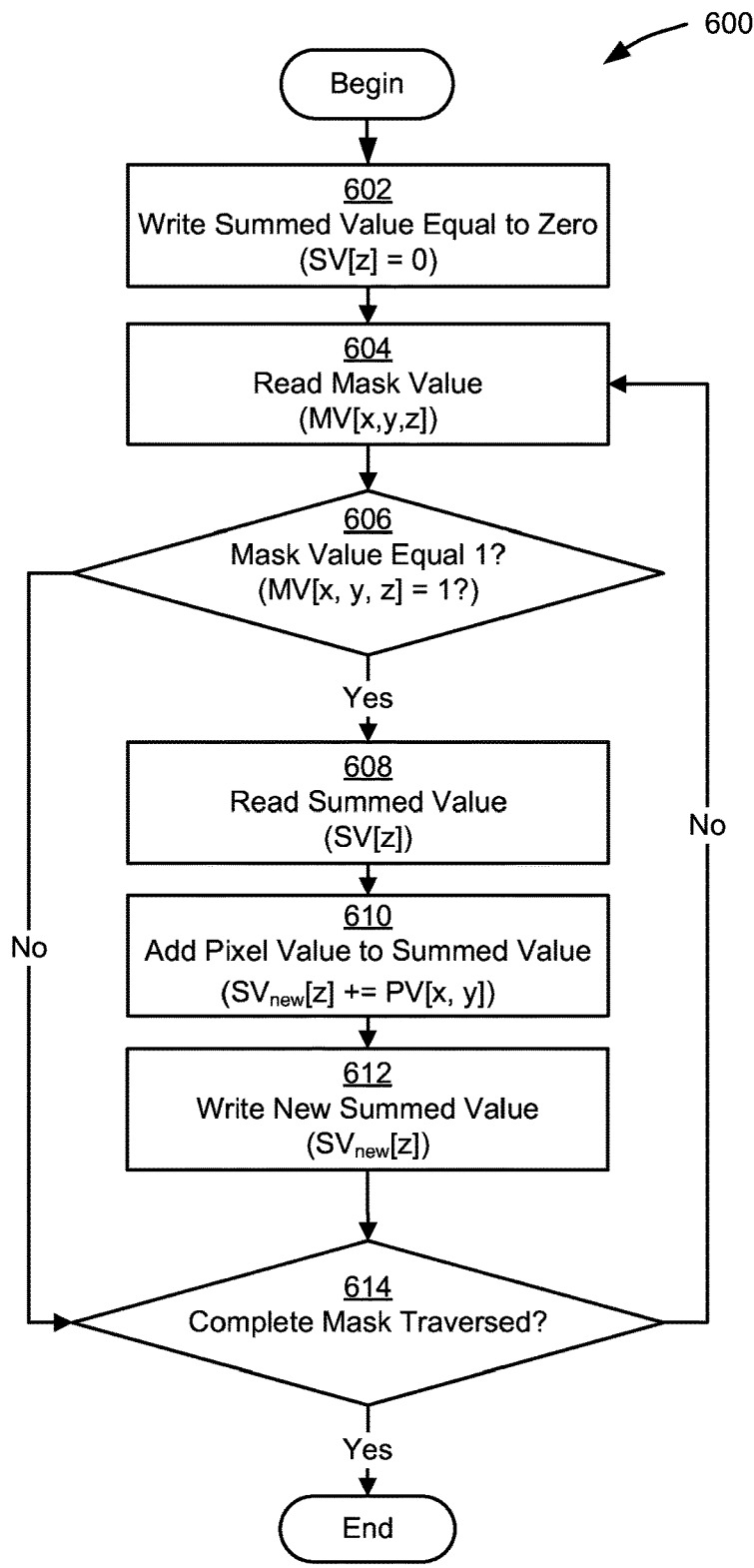
FIG. 6 is a flow diagram illustrating an example method of applying masks to pixel values.

FIG. 6 illustrates an example process for generating the coded aggregates 600 performed by the compute element array for measurement matrices including decimal values "0" and "1". The pixel values for a two dimensional image section are represented by PV[x, y]. The mask values for a given set of measurement matrices is represented by the MV[x, y, z] where each x and y coordinate corresponds to a pixel value (e.g., PV[x, y]) and the z coordinate corresponds to a particular measurement matrix in the set of measurement matrices. The coded aggregates for a given measurement matrix z are stored as summed values SV[z]. It is appreciated that process 600 may be adapted to use measurement matrices with other combinations than "0" and "1" including, for example, "−1" "0" and "1" or "−1" and "1."

In act 602, the summed value is set to zero (e.g., SV[z]) in the memory of the compute element. Setting the memory location to zero may remove results from any previous computations remaining in the memory. In act 604, a particular mask value is read (e.g., MV[x, y, z]). As discussed above, the mask value may be either a "0" or a "1." In act 606, the compute element determines whether the read mask value is equal to 1. If the mask value is equal to 1, the compute element proceeds to act 608 to read the summed value (e.g., SV[z]) associated with the mask value, act 610 to add the pixel value (e.g., PV[x, y]) to the summed value (e.g., SV[z]), and act 613 to write the new summed value (e.g., $SV_{new}[z]$) to the memory. Otherwise, the compute element proceeds to act 614 and determines whether the mask has been completely traversed. If the mask has been completely traversed, the process 600 ends. Otherwise, the compute element returns to act 604 to select a new mask value.

Each of the processes disclosed herein depicts one particular sequence of acts in a particular example. The acts included in each of these processes may be performed by, or using, an audio device specially configured as discussed herein. Some acts are optional and, as such, may be omitted in accord with one or more examples. Additionally, the order of acts can be altered, or other acts can be added, without departing from the scope of the systems and methods discussed herein. In addition, as discussed above, in at least one example, the acts are performed on a particular, specially configured machine, namely a ROIC configured according to the examples disclosed herein.

Having described above several aspects of at least one embodiment, it is to be appreciated various alterations, modifications, and improvements will readily occur to those skilled in the art. For example, known compression algorithms (e.g., JPEG or MPEG compression algorithms) may be implemented in combination with the various embodiments described above. Such alterations, modifications, and improvements are intended to be part of this disclosure and are intended to be within the scope of the invention. Accordingly, the foregoing description and drawings are by way of example only. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items.

What is claimed is:

1. A Read-Out Integrated Circuit (ROIC) with integrated Compressive Sampling (CS) configured to couple to a photodetector array including a plurality of photodetectors, the ROIC comprising:

a mask generator and control component configured to generate a plurality of Compressive Sampling Measurement Matrices (CSMMs) each descriptive of a sampling pattern to sample at least one portion of the photodetector array; and a compute element array coupled to the photodetector array and the mask generator and control component, the compute element array configured to:
receive a plurality of photodetector values from the photodetector array;
receive the CSMMs from the mask generator and control component;
generate compressed image data by selectively sampling, in parallel, a plurality of portions of the photodetector array consistent with the plurality of CSMMs, wherein each of the CSMMs specify selected photodetector values to be sampled within a corresponding portion of the plurality of portions, and the compressed image data includes a plurality of coded aggregates; and
provide the compressed image data to at least one processor.

2. The ROIC according to claim 1, wherein the compute element array includes a plurality of compute elements each including a memory coupled to a logic core.

3. The ROIC according to claim 2, wherein the memory includes 2-port static random access memory (SRAM).

4. The ROIC according to claim 2, wherein the memory stores the compressed image data and the logic core is configured to determine the compressed image data.

5. The ROIC according to claim 2, further comprising a block mapping component configured to direct at least one portion of the plurality of photodetector values to each compute element of the plurality of compute elements.

6. The ROIC according to claim 1, wherein the mask generator and control component includes at least one of a pseudo-random number generator and a unique-random number generator.

7. The ROIC according to claim 1, wherein the mask generator and control component includes a memory and wherein the mask generator and control component generates the plurality of CSMMs at least in part by reading at least one stored CSMM from the memory.

8. The ROIC according to claim 1, wherein one or more portions of the plurality of portions of the photodetector array have a compression rate of one.

9. The ROIC according to claim 1, further comprising an analog-to-digital converter (ADC) coupled to the compute element array and configured to digitize the plurality of photodetector values received from the photodetector array.

10. The ROIC according to claim 1, wherein each CSMM of the plurality of CSMMs includes at least one of a decimal zero, a decimal one, and a decimal negative one.

11. The ROIC according to claim 1, wherein the plurality of photodetectors includes a plurality of digital pixels and wherein the plurality of photodetector values includes a plurality of pixel values.

12. The ROIC according to claim 1, wherein each coded aggregate of the plurality of coded aggregates is a sum of the photodetector values specified by one CSMM of the plurality of CSMMs.

13. A focal plane array (FPA) imaging system comprising:
at least one processor;
a photodetector array including a plurality of photodetectors; and
a Read-Out Integrated Circuit (ROIC) with integrated Compressive Sampling (CS) coupled between the at least one processor and the photodetector array, the ROIC being configured to:
generate a plurality of Compressive Sampling Measurement Matrices (CSMMs) each descriptive of a sampling pattern to sample at least one portion of the plurality of photodetectors,
generate compressed image data by selectively sampling, in parallel, a plurality of portions of the plurality of photodetectors consistent with the plurality of CSMMs, wherein each of the CSMMs specify photodetector values to be sampled within a corresponding portion of the plurality of portions, and the compressed image data includes a plurality of coded aggregates, and
output the compressed image data to the at least one processor.

14. The system according to claim 13, wherein the photodetector array includes a plurality of digital pixels.

15. The system according to claim 13, wherein the ROIC includes a mask generator and control component configured to generate the plurality of CSMMs.

16. The system according to claim 15, wherein the mask generator and control component includes at least one of a pseudo-random number generate and a unique-random number generator.

17. The system according to claim 13, wherein the ROIC includes a compute element array configured to generate the compressed image data including a memory coupled to a logic core.

18. The system according to claim 13, further comprising an image reconstruction engine configured to instruct the at least one processor to reconstruct at least one image based on the compressed image data.

19. The system according to claim 13, wherein each coded aggregate of the plurality of coded aggregates is a sum of the photodetector values specified by one CSMM of the plurality of CSMMs.

* * * * *